(12) United States Patent
Adhiprakasha

(10) Patent No.: US 9,005,366 B2
(45) Date of Patent: Apr. 14, 2015

(54) IN-SITU REACTOR CLEANING IN HIGH PRODUCTIVITY COMBINATORIAL SYSTEM

(75) Inventor: Edwin Adhiprakasha, Mountain View, CA (US)

(73) Assignee: Intermolecular, Inc., San Jose, CA (US)

( * ) Notice: Subject to any disclaimer, the term of this patent is extended or adjusted under 35 U.S.C. 154(b) by 777 days.

(21) Appl. No.: 13/267,754

(22) Filed: Oct. 6, 2011

(65) Prior Publication Data

US 2013/0087166 A1     Apr. 11, 2013

(51) Int. Cl.
*B08B 7/02*     (2006.01)
*H01L 21/67*     (2006.01)
*C23C 16/44*     (2006.01)
*H01J 37/32*     (2006.01)

(52) U.S. Cl.
CPC ............. *B08B 7/02* (2013.01); *H01L 21/67057* (2013.01); *C23C 16/4407* (2013.01); *H01J 37/32816* (2013.01); *H01J 37/32862* (2013.01)

(58) Field of Classification Search
None
See application file for complete search history.

(56) References Cited

U.S. PATENT DOCUMENTS

| | | | | |
|---|---|---|---|---|
| 2,029,117 | A | * | 1/1936 | Otis ................................ 34/222 |
| 2,648,475 | A | * | 8/1953 | Martin ............................. 141/1 |
| 5,671,546 | A | | 9/1997 | Haala |
| 2003/0154999 | A1 | | 8/2003 | Shih et al. |
| 2007/0285631 | A1 | | 12/2007 | Stavenga et al. |
| 2009/0071503 | A1 | | 3/2009 | Branz et al. |

OTHER PUBLICATIONS

Hatter, K.; How to Get Spray Starch Off a Teflon Iron; 2011; Demand Media, Inc.; ehow.com, http://www.ehow.com/how_5509633_spray-starch-off-teflon-iron.html.
Ashman1; How Do You Clean the Surface of a Teflon Fry Pan?; 2011; Answers Corporation; Answer.com; http://wiki.answers.com/Q/How_do_you_clean_the_surface_of_a_teflon_fry_pan.
The TubDoctor; Limited Warranty Subject to Care & Maintenance Requirements Below; 2008; http://www.tubdoctor.net/warranty.html.
Spookare; How Do I Clean the Teflon Surface of an Iron?; Aug. 28, 2006; Yahoo Answers; http://answers.yahoo.com/question/index?qid=20060827183039AABUvR3.
Bauerle, D., et al.; Chapter 1 Laser Cleaning and Surface Modifications: Applications in Nano- and Biotechnology; May 21, 2006; Institut for Angewandte Physik, Linz, Austria; 28 pages.
Nickerson, R.; Plasma Surface Modification for Cleaning and Adhesion; AST Products, Inc.; 6 pages.
IMTEC; Megasonics vs. Ultrasonics; 2011; IMTEC; Imtec Acculine, Inc.; http://www.imtecacculine.com/rc_semi_meg_vs_ultra.html.
Applied Surface Technologies; Price List CO2 Snow Jet Cleaniing; 1996; http://www.co2clean.com/prices.html.
Plasma Etch Inc.; PE-2000R I Reel to Reel Plasma Etcher; 2010; http://www.plasmaetch.com/PE-2000R_plasma_system.html.

\* cited by examiner

Primary Examiner — Eric Golightly

(57) ABSTRACT

The present invention discloses a cleaning process, utilizing a gas flow to an interior of a hollow object in a fluid ambient. After capping the object to seal off the interior volume, gas is introduced to the object interior. The pressure is built up within the object interior, loosening the seal. The gas pressure is released, and the seal returns. The vibration caused by the cycling of gas pressure can be used to perform cleaning of particles adhering to the object. The cleaning process can be used in a combinatorial processing system, enabling in-situ cleaning of process reactor assemblies.

7 Claims, 12 Drawing Sheets

```
┌─────────────────────────────────────────────────┐
│ Applying a force to the reactor module to seal  │
│ each reactor of the reactor module against a    │
│ substrate surface                                │
│ 1100                                             │
└─────────────────────────────────────────────────┘
                        │
                        ▼
┌─────────────────────────────────────────────────┐
│ Introducing a fluid to immerse the substrate    │
│ and a portion of the reactor module              │
│ 1110                                             │
└─────────────────────────────────────────────────┘
                        │
                        ▼
┌─────────────────────────────────────────────────┐
│ Flowing a gas to an interior of at least a       │
│ reactor of the reactor module to vibrate the     │
│ at least a reactor against the substrate         │
│ surface                                          │
│ 1120                                             │
└─────────────────────────────────────────────────┘
                        │
                        ▼
┌─────────────────────────────────────────────────┐
│ Controlling a gas flow rate to achieve a         │
│ vibration frequency of the at least a reactor    │
│ 1130                                             │
└─────────────────────────────────────────────────┘
                        │
                        ▼
┌─────────────────────────────────────────────────┐
│ Replacing the fluid with a new fluid             │
│ 1140                                             │
└─────────────────────────────────────────────────┘
                        │
                        ▼
┌─────────────────────────────────────────────────┐
│ Replacing the substrate with a new substrate     │
│ 1150                                             │
└─────────────────────────────────────────────────┘
```

FIG. 11

```
┌─────────────────────────────────────────────────┐
│  Combinatorially processing multiple regions    │
│  of a first substrate in the HPC equipment      │
│  using the reactor module                       │
│                   1200                          │
└─────────────────────────────────────────────────┘
                         │
                         ▼
┌─────────────────────────────────────────────────┐
│  In-situ cleaning the reactor module,           │
│  comprising                                     │
│                                                 │
│  Introducing a second substrate;                │
│                                                 │
│  Applying a force to the reactor module to      │
│  seal each reactor of the reactor module        │
│  against the second substrate surface;          │
│  introducing a fluid to immerse the second      │
│  substrate and a portion of the reactor         │
│  module; and                                    │
│                                                 │
│  Flowing a gas to an interior of at least a     │
│  reactor of the reactor module to vibrate the   │
│  at least a reactor against the second          │
│  substrate surface                              │
│                   1210                          │
└─────────────────────────────────────────────────┘
                         │
                         ▼
┌─────────────────────────────────────────────────┐
│  Combinatorially processing a third substrate   │
│  using the reactor module                       │
│                   1220                          │
└─────────────────────────────────────────────────┘
```

FIG. 12

IN-SITU REACTOR CLEANING IN HIGH PRODUCTIVITY COMBINATORIAL SYSTEM

FIELD OF THE INVENTION

The present invention relates generally to combinatorial methods for device process development.

BACKGROUND OF THE INVENTION

The manufacture of advanced semiconductor devices entails the integration and sequencing of many unit processing steps, with potential new material and process developments. The precise sequencing and integration of the unit processing steps enables the formation of functional devices meeting desired performance metrics such as power efficiency, signal propagation, and reliability.

As part of the discovery, optimization and qualification of each unit process, it is desirable to be able to i) test different materials, ii) test different processing conditions within each unit process module, iii) test different sequencing and integration of processing modules within an integrated processing tool, iv) test different sequencing of processing tools in executing different process sequence integration flows, and combinations thereof in the manufacture of devices such as integrated circuits. In particular, there is a need to be able to test i) more than one material, ii) more than one processing condition, iii) more than one sequence of processing conditions, iv) more than one process sequence integration flow, and combinations thereof, collectively known as "combinatorial process sequence integration", on a single monolithic substrate without the need of consuming the equivalent number of monolithic substrates per material(s), processing condition(s), sequence(s) of processing conditions, sequence(s) of processes, and combinations thereof. This can greatly improve both the speed and reduce the costs associated with the discovery, implementation, optimization, and qualification of material(s), process(es), and process integration sequence(s) required for manufacturing.

Systems and methods for High Productivity Combinatorial (HPC) processing are described in U.S. Pat. No. 7,544,574 filed on Feb. 10, 2006, U.S. Pat. No. 7,824,935 filed on Jul. 2, 2008, U.S. Pat. No. 7,871,928 filed on May 4, 2009, U.S. Pat. No. 7,902,063 filed on Feb. 10, 2006, and U.S. Pat. No. 7,947,531 filed on Aug. 28, 2009 which are all herein incorporated by reference. Systems and methods for HPC processing are further described in U.S. patent application Ser. No. 11/352,077 filed on Feb. 10, 2006, claiming priority from Oct. 15, 2005, U.S. patent application Ser. No. 11/419,174 filed on May 18, 2006, claiming priority from Oct. 15, 2005, U.S. patent application Ser. No. 11/674,132 filed on Feb. 12, 2007, claiming priority from Oct. 15, 2005, and U.S. patent application Ser. No. 11/674,137 filed on Feb. 12, 2007, claiming priority from Oct. 15, 2005 which are all herein incorporated by reference.

HPC processing techniques have been used in wet chemical processing such as etching and cleaning. HPC processing techniques have also been used in deposition processes such as physical vapor deposition (PVD), atomic layer deposition (ALD), and chemical vapor deposition (CVD).

Currently, manual cleaning has been used for HPC systems, comprising shutting down the HPC systems, manually removing HPC reactor components to be ultrasonic cleaned in cleaning solvent. The process is tedious, time-consuming, and lowering the productivity of the HPC system. There is a need for automatic and in-situ cleaning of HPC systems.

SUMMARY OF THE DESCRIPTION

In some embodiments, the present invention discloses systems and methods for cleaning an object in a fluid ambient, using pressure from a gas flow to vibrate the object. The vibration can dislodge the particles adhered to the object surface, releasing the particles to the fluid media. The object preferably comprises a hollow interior communicated with a surface opening.

In some embodiments, the cleaning process comprises applying a force to the object to press the object against a substrate surface to form a seal, sealing the opening of the object by the substrate surface. The object and the substrate are partially submerged in a fluid, wherein the fluid covers at least the seal area between the object opening and the substrate surface. A gas is flowed to the interior of the object to build up a gas pressure within the object interior. When the force on the object interior caused by the gas pressure is higher than the externally applied force, the object is lifted from the substrate surface, and the gas is released through the opening. The gas pressure is reduced, and the object falls back to the substrate. The cycle continues with the object vibrating against the substrate surface, for example, due to the turbulence of the gas flow within the object. The vibration can clean the object from any adhering particles, for example, particles at the seal area between the object and the substrate.

In some embodiments, the present vibrational cleaning process can be used in a high productivity combinatorial (HPC) system. During normal operation of an HPC system, a reactor module comprising a plurality of reactors can create a plurality of isolated regions on a substrate surface. The isolated regions are processed with process conditions, device structure or materials varying in a combinatorial manner. In an exemplary configuration, a reactor comprises a sleeve shape, pressing on a region of the substrate surface to create an isolated processing region. The pressing contact can generate particles accumulated on the reactor, which will need to be periodically cleaned.

In some embodiments, the present invention discloses methods to operate an HPC system, comprising periodically cleaning the reactor module in-situ after a number of processed substrates. After processing a number of substrates, the reactor surfaces, especially the surface in contact with the substrate, can be contaminated with particles, for example, due to contact friction. In some embodiments, the present invention discloses cleaning the reactors, preferably in-situ cleaning, after processing a number of substrates to reduce or eliminate the particles adhering to the reactor surfaces.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which:

FIG. 11 illustrates an exemplary flowchart for cleaning the reactors in an HPC system according to some embodiments of the present invention.

FIG. 12 illustrates an exemplary flowchart for in-situ cleaning the reactors in an HPC system according to some embodiments of the present invention.

DETAILED DESCRIPTION

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

The present invention relates to systems and methods for cleaning an object in a fluid ambient, using pressure from a gas flow to vibrate the object. The vibration can dislodge the particles adhered to the object surface, releasing the particles to the fluid media. In some embodiments, the present invention discloses methods and systems for use in high productivity combinatorial processes.

"Combinatorial Processing" generally refers to techniques of differentially processing multiple regions of one or more substrates. Combinatorial processing generally varies materials, unit processes or process sequences across multiple regions on a substrate. The varied materials, unit processes, or process sequences can be evaluated (e.g., characterized) to determine whether further evaluation of certain process sequences is warranted or whether a particular solution is suitable for production or high volume manufacturing.

Figure 1:
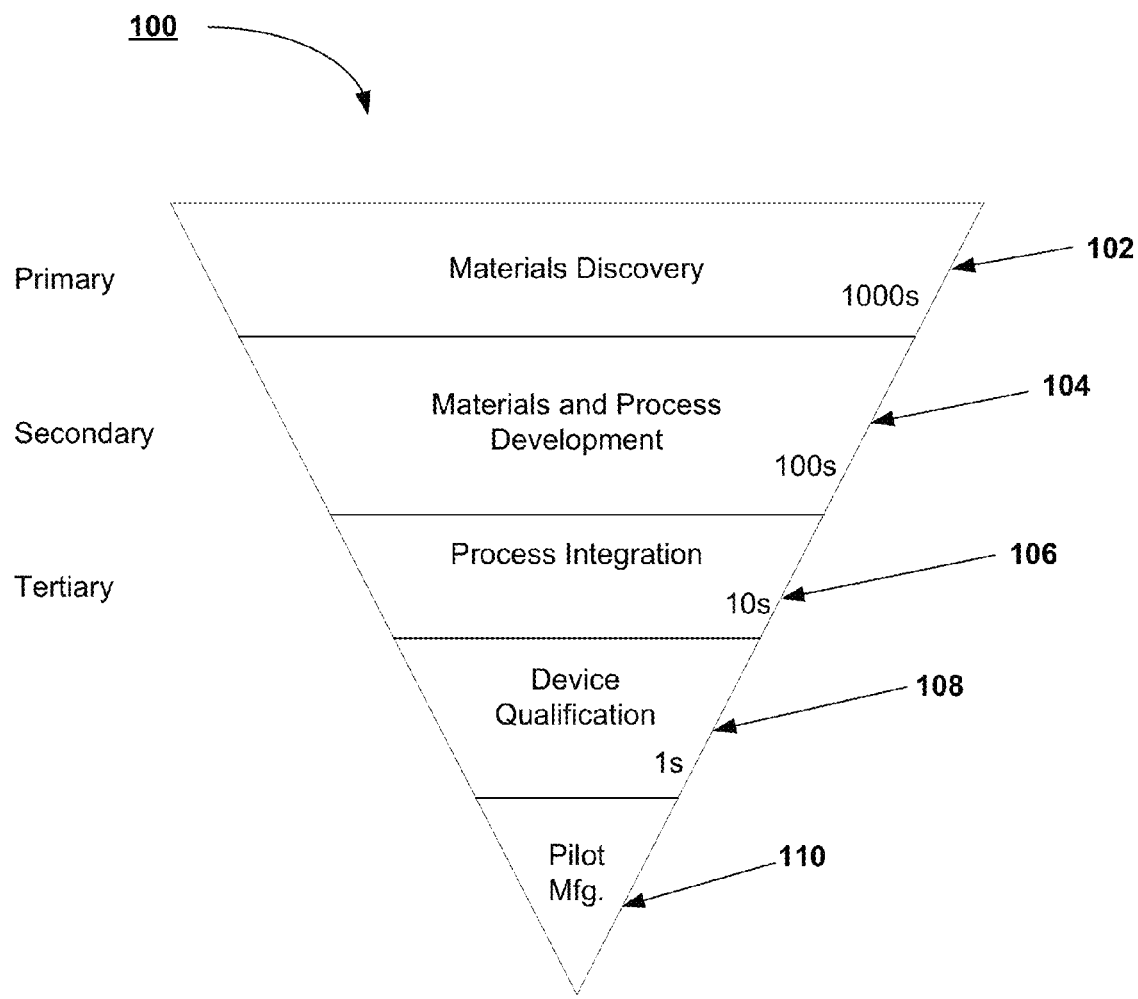
FIG. 1 illustrates a schematic diagram, 100, for implementing combinatorial processing and evaluation using primary, secondary, and tertiary screening.

FIG. 1 illustrates a schematic diagram, 100, for implementing combinatorial processing and evaluation using primary, secondary, and tertiary screening. The schematic diagram, 100, illustrates that the relative number of combinatorial processes run with a group of substrates decreases as certain materials and/or processes are selected. Generally, combinatorial processing includes performing a large number of processes during a primary screen, selecting promising candidates from those processes, performing the selected processing during a secondary screen, selecting promising candidates from the secondary screen for a tertiary screen, and so on. In addition, feedback from later stages to earlier stages can be used to refine the success criteria and provide better screening results.

For example, thousands of materials are evaluated during a materials discovery stage, 102. Materials discovery stage, 102, is also known as a primary screening stage performed using primary screening techniques. Primary screening techniques may include dividing substrates into coupons and depositing materials using varied processes. The materials are then evaluated, and promising candidates are advanced to the secondary screen, or materials and process development stage, 104. Evaluation of the materials is performed using metrology tools such as electronic testers and imaging tools (i.e., microscopes).

The materials and process development stage, 104, may evaluate hundreds of materials (i.e., a magnitude smaller than the primary stage) and may focus on the processes used to deposit or develop those materials. Promising materials and processes are again selected, and advanced to the tertiary screen or process integration stage, 106, where tens of materials and/or processes and combinations are evaluated. The tertiary screen or process integration stage, 106, may focus on integrating the selected processes and materials with other processes and materials.

The most promising materials and processes from the tertiary screen are advanced to device qualification, 108. In device qualification, the materials and processes selected are evaluated for high volume manufacturing, which normally is conducted on full substrates within production tools, but need not be conducted in such a manner. The results are evaluated to determine the efficacy of the selected materials and processes. If successful, the use of the screened materials and processes can proceed to pilot manufacturing, 110.

The schematic diagram, 100, is an example of various techniques that may be used to evaluate and select materials and processes for the development of new materials and processes. The descriptions of primary, secondary, etc. screening and the various stages, 102-110, are arbitrary and the stages may overlap, occur out of sequence, be described and be performed in many other ways.

This application benefits from High Productivity Combinatorial (HPC) techniques described in U.S. patent application Ser. No. 11/674,137 filed on Feb. 12, 2007 which is hereby incorporated for reference in its entirety. Portions of the '137 application have been reproduced below to enhance the understanding of the present invention. The embodiments described herein enable the application of combinatorial techniques to process sequence integration in order to arrive at a globally optimal sequence of device fabrication processes by considering interaction effects between the unit manufacturing operations, the process conditions used to effect such unit manufacturing operations, hardware details used during the processing, as well as materials characteristics of components utilized within the unit manufacturing operations. Rather than only considering a series of local optimums, i.e., where the best conditions and materials for each manufacturing unit operation is considered in isolation, the embodiments described below consider interactions effects introduced due to the multitude of processing operations that are performed and the order in which such multitude of processing operations are performed. A global optimum sequence order is therefore derived, and as part of this derivation, the unit processes, unit process parameters and materials used in the unit process operations of the optimum sequence order are also considered.

The embodiments described further analyze a portion or sub-set of the overall process sequence used to manufacture a semiconductor device. Once the subset of the process sequence is identified for analysis, combinatorial process sequence integration testing is performed to optimize the materials, unit processes, hardware details, and process sequence used to build that portion of the device or structure. During the processing of some embodiments described herein, structures are formed on the processed substrate which are equivalent to the structures formed during actual production of the device. For example, such structures may include, but would not be limited to, gate dielectric layers, gate electrode layers, spacers, or any other series of layers or unit processes that create an intermediate structure found on semiconductor devices. While the combinatorial processing varies certain materials, unit processes, hardware details, or process sequences, the composition or thickness of the layers or structures or the action of the unit process, such as cleaning, surface preparation, deposition, surface treatment, etc. is substantially uniform through each discrete region. Furthermore, while different materials or unit processes may be used for corresponding layers or steps in the formation of a structure in different regions of the substrate during the combinatorial processing, the application of each layer or use of a given unit process is substantially consistent or uniform throughout the different regions in which it is intentionally applied. Thus, the processing is uniform within a region (inter-region uniformity) and between regions (intra-region uniformity), as desired. It should be noted that the process can be varied between regions, for example, where a thickness of a layer is varied or a material may be varied between the regions, etc., as desired by the design of the experiment.

The result is a series of regions on the substrate that contain structures or unit process sequences that have been uniformly applied within that region and, as applicable, across different regions. This process uniformity allows comparison of the properties within and across the different regions such that the variations in test results are due to the varied parameter (e.g., materials, unit processes, unit process parameters, hardware details, or process sequences) and not the lack of process uniformity. In the embodiments described herein, the positions of the discrete regions on the substrate can be defined as needed, but are preferably systematized for ease of tooling and design of experimentation. In addition, the number, variants and location of structures within each region are designed to enable valid statistical analysis of the test results within each region and across regions to be performed.

Figure 2:
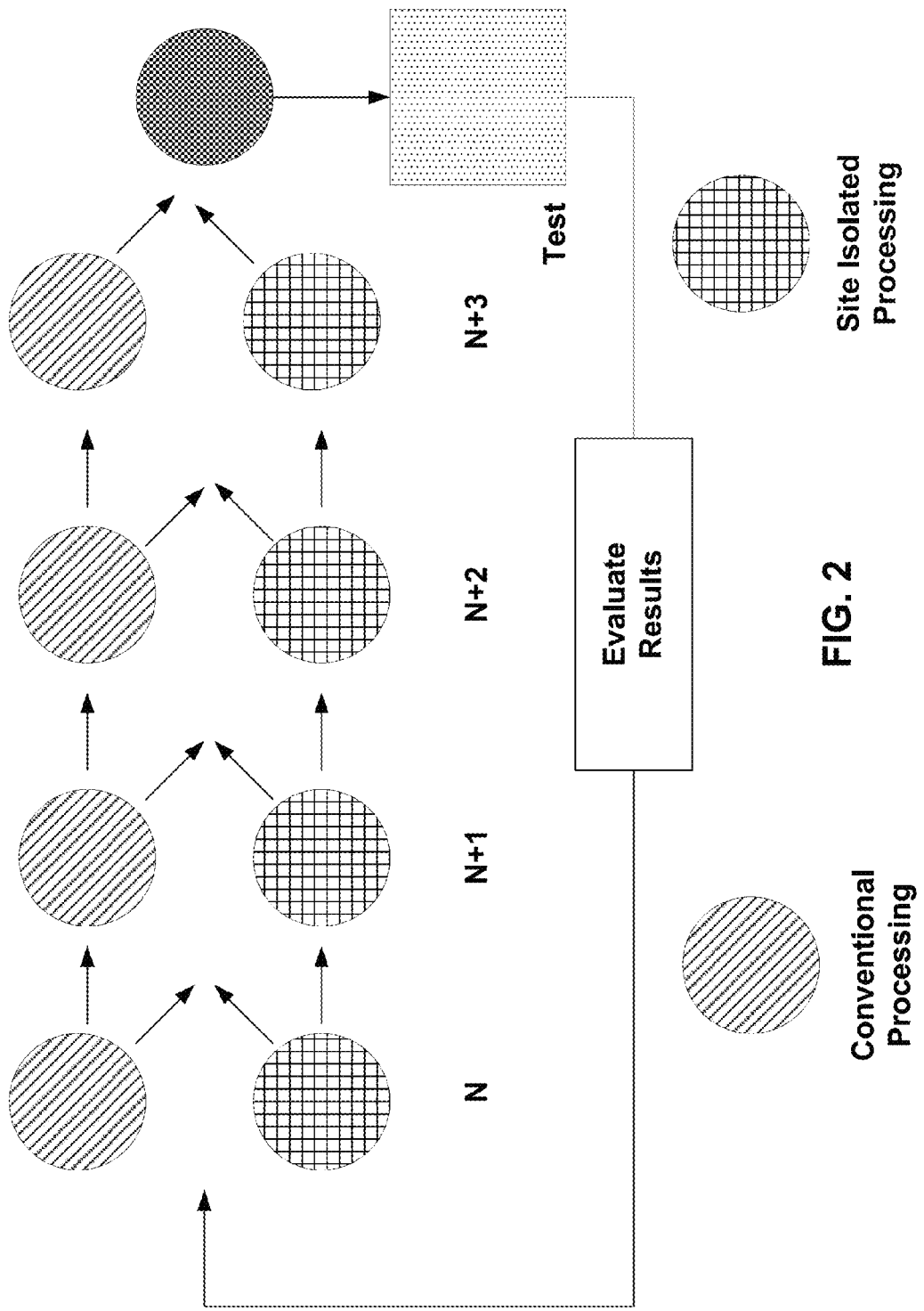
FIG. 2 is a simplified schematic diagram illustrating a general methodology for combinatorial process sequence integration that includes site isolated processing and/or conventional processing in accordance with one embodiment of the invention.

FIG. 2 is a simplified schematic diagram illustrating a general methodology for combinatorial process sequence integration that includes site isolated processing and/or conventional processing in accordance with one embodiment of the invention. In one embodiment, the substrate is initially processed using conventional process N. In one exemplary embodiment, the substrate is then processed using site isolated process N+1. During site isolated processing, an HPC module may be used, such as the HPC module described in U.S. patent application Ser. No. 11/352,077 filed on Feb. 10, 2006. The substrate can then be processed using site isolated process N+2, and thereafter processed using conventional process N+3. Testing is performed and the results are evaluated. The testing can include physical, chemical, acoustic, magnetic, electrical, optical, etc. tests. From this evaluation, a particular process from the various site isolated processes (e.g. from steps N+1 and N+2) may be selected and fixed so that additional combinatorial process sequence integration may be performed using site isolated processing for either process N or N+3. For example, a next process sequence can include processing the substrate using site isolated process N, conventional processing for processes N+1, N+2, and N+3, with testing performed thereafter.

It should be appreciated that various other combinations of conventional and combinatorial processes can be included in the processing sequence with regard to FIG. 2. That is, the combinatorial process sequence integration can be applied to any desired segments and/or portions of an overall process flow. Characterization, including physical, chemical, acoustic, magnetic, electrical, optical, etc. testing, can be performed after each process operation, and/or series of process operations within the process flow as desired. The feedback provided by the testing is used to select certain materials, processes, process conditions, and process sequences and eliminate others. Furthermore, the above flows can be applied to entire monolithic substrates, or portions of monolithic substrates such as coupons.

Under combinatorial processing operations the processing conditions at different regions can be controlled independently. Consequently, process material amounts, reactant species, processing temperatures, processing times, processing pressures, processing flow rates, processing powers, processing reagent compositions, the rates at which the reactions are quenched, deposition order of process materials, process sequence steps, hardware details, etc., can be varied from region to region on the substrate. Thus, for example, when exploring materials, a processing material delivered to a first and second region can be the same or different. If the processing material delivered to the first region is the same as the processing material delivered to the second region, this processing material can be offered to the first and second regions on the substrate at different concentrations. In addition, the material can be deposited under different processing parameters. Parameters which can be varied include, but are not limited to, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, hardware details of the gas distribution assembly, etc. It should be appreciated that these process parameters are exemplary and not meant to be an exhaustive list as other process parameters commonly used in semiconductor manufacturing may be varied.

As mentioned above, within a region, the process conditions are substantially uniform, in contrast to gradient processing techniques which rely on the inherent non-uniformity of the material deposition. That is, the embodiments, described herein locally perform the processing in a conventional manner, e.g., substantially consistent and substantially uniform, while globally over the substrate, the materials, processes, and process sequences may vary. Thus, the testing will find optimums without interference from process variation differences between processes that are meant to be the same. It should be appreciated that a region may be adjacent to another region in one embodiment or the regions may be isolated and, therefore, non-overlapping. When the regions are adjacent, there may be a slight overlap wherein the materials or precise process interactions are not known, however, a portion of the regions, normally at least 50% or more of the area, is uniform and all testing occurs within that region. Further, the potential overlap is only allowed with material of processes that will not adversely affect the result of the tests. Both types of regions are referred to herein as regions or discrete regions.

Combinatorial processing can be used to produce and evaluate different materials, chemicals, processes, process and integration sequences, and techniques related to semiconductor fabrication. For example, combinatorial processing can be used to determine optimal processing parameters (e.g., power, time, reactant flow rates, temperature, etc.) of dry processing techniques such as dry etching (e.g., plasma etching, flux-based etching, reactive ion etching (RIE)) and dry deposition techniques (e.g., physical vapor deposition (PVD), chemical vapor deposition (CVD), atomic layer deposition (ALD), etc.). Combinatorial processing can be used to determine optimal processing parameters (e.g., time, concentration, temperature, stirring rate, etc.) of wet processing techniques such as wet etching, wet cleaning, rinsing, and wet deposition techniques (e.g., electroplating, electroless deposition, chemical bath deposition, etc.).

Figure 3:
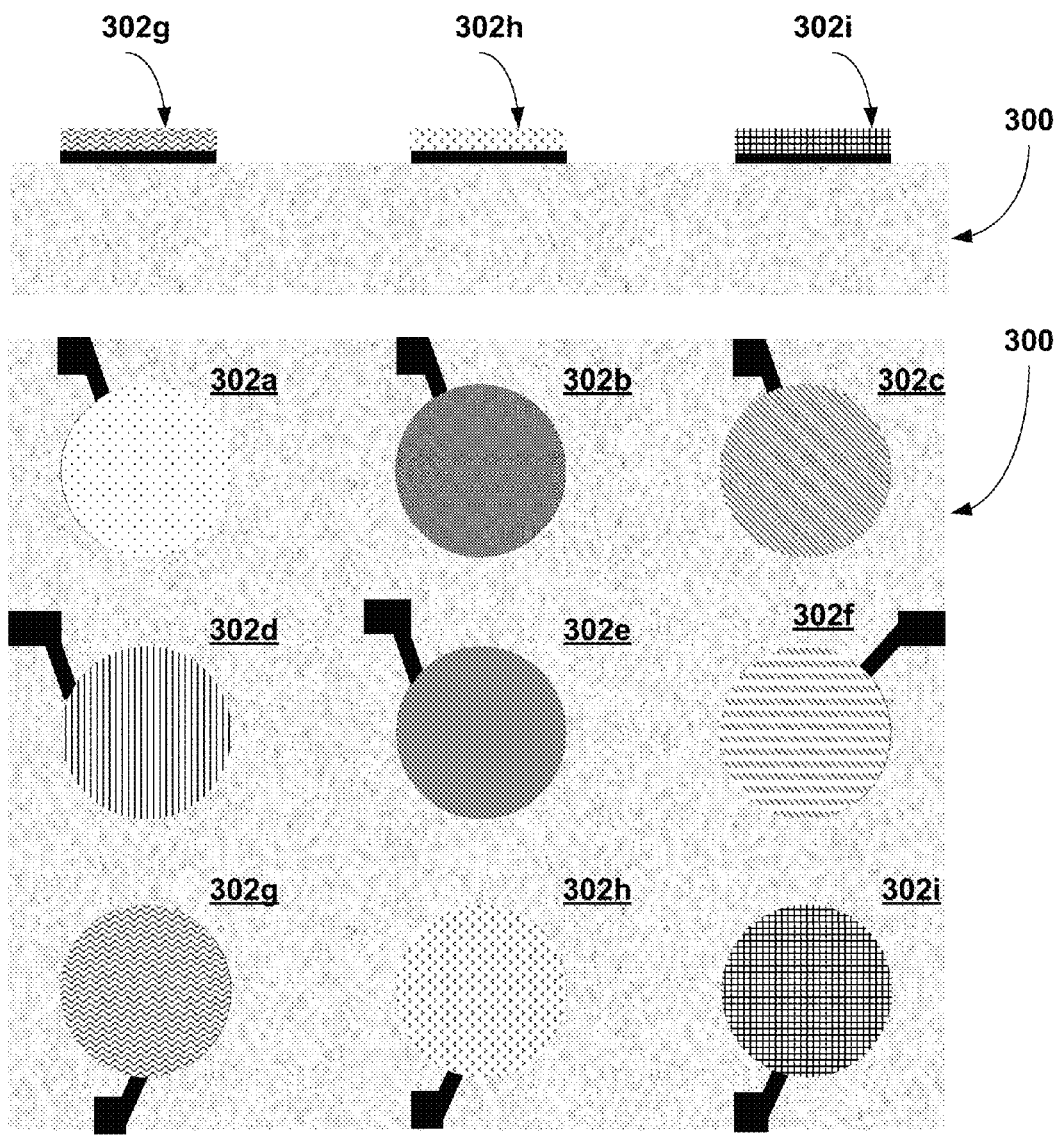
FIG. 3 illustrates a schematic diagram of a substrate that has been processed in a combinatorial manner.

FIG. 3 illustrates a schematic diagram of a substrate that has been processed in a combinatorial manner. A substrate, 300, is shown with nine site isolated regions, 302a-302i, illustrated thereon. Although the substrate 300 is illustrated as being a generally square shape, those skilled in the art will understand that the substrate may be any useful shape such as round, rectangular, etc. The lower portion of FIG. 3 illustrates a top down view while the upper portion of FIG. 3 illustrates a cross-sectional view taken through the three site isolated regions, 302g-302i. The shading of the nine site isolated regions illustrates that the process parameters used to process these regions have been varied in a combinatorial manner. The substrate may then be processed through a next step that may be conventional or may also be a combinatorial step as discussed earlier with respect to FIG. 2.

Figure 4:
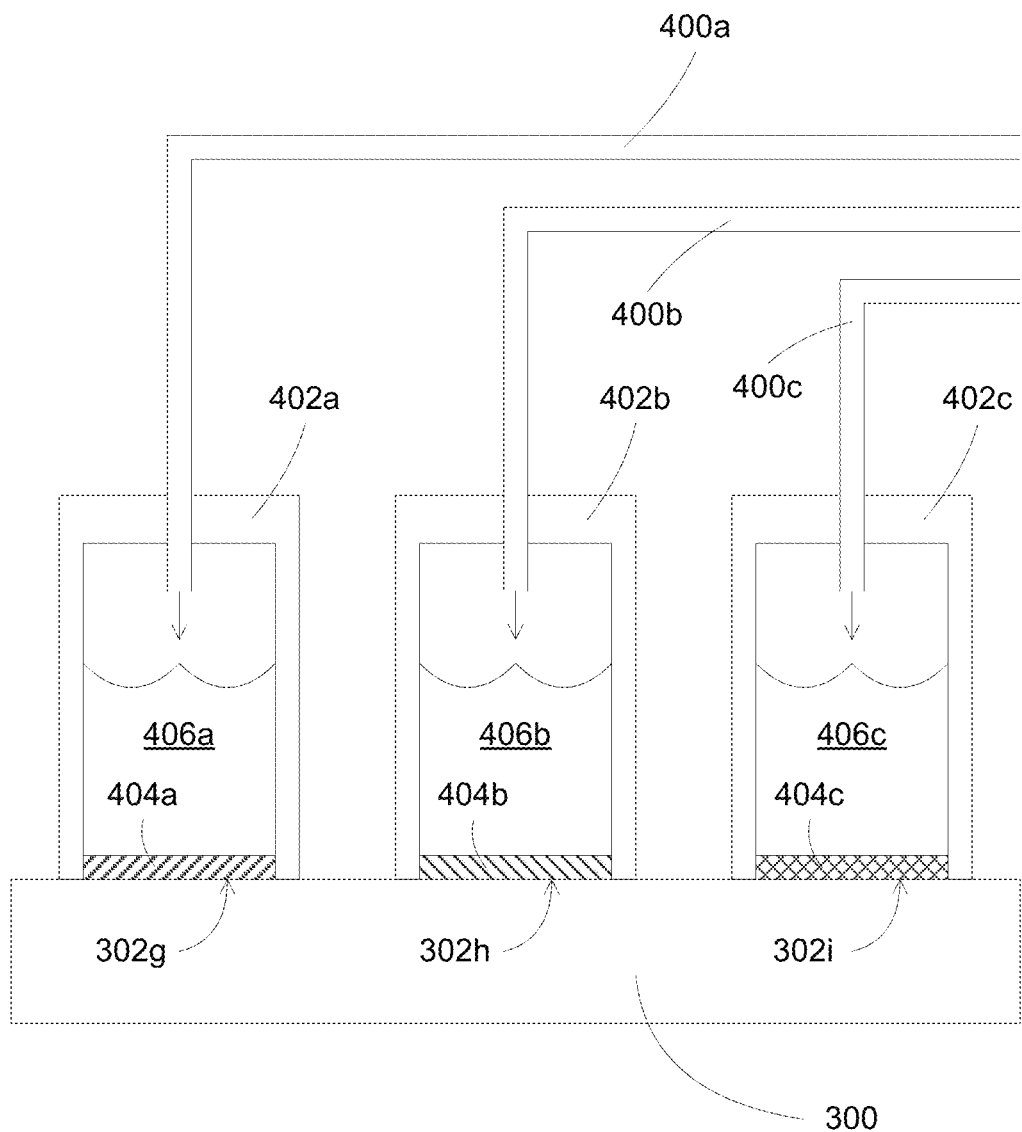
FIG. 4 illustrates a schematic diagram of a combinatorial wet processing system according to an embodiment described herein.

FIG. 4 illustrates a schematic diagram of a combinatorial wet processing system according to an embodiment described herein. A combinatorial wet system may be used to investigate materials deposited by solution-based techniques. An example of a combinatorial wet system is described in U.S. Pat. No. 7,544,574 cited earlier. Those skilled in the art will realize that this is only one possible configuration of a combinatorial wet system. FIG. 4 illustrates a cross-sectional view of substrate, 300, taken through the three site isolated regions, 302g-302i similar to the upper portion of FIG. 3. Solution dispensing nozzles, 400a-400c, supply different solution chemistries, 406a-406c, to chemical processing cells, or reactors, 402a-402c. FIG. 4 illustrates the deposition of a layer, 404a-404c, on respective site isolated regions. Although FIG. 4 illustrates a deposition step, other solution-based processes such as cleaning, etching, surface treatment, surface functionalization, etc. may be investigated in a combinatorial manner. Advantageously, the solution-based treatment can be customized for each of the site isolated regions.

In some embodiments, the site isolated regions are the areas of interest in a combinatorial process, since they provide the variations of process and material parameters, which can be evaluated to obtain the optimum device structures and fabrication processes. In some embodiments, the surface areas outside the isolated regions are also processed, such as, to clean or etch the outside surface area. For example, to clean the outside surface areas with a wet cleaning fluid, the isolated regions are protected and cleaning chemical is introduced to the substrate surface.

Figure 5A:
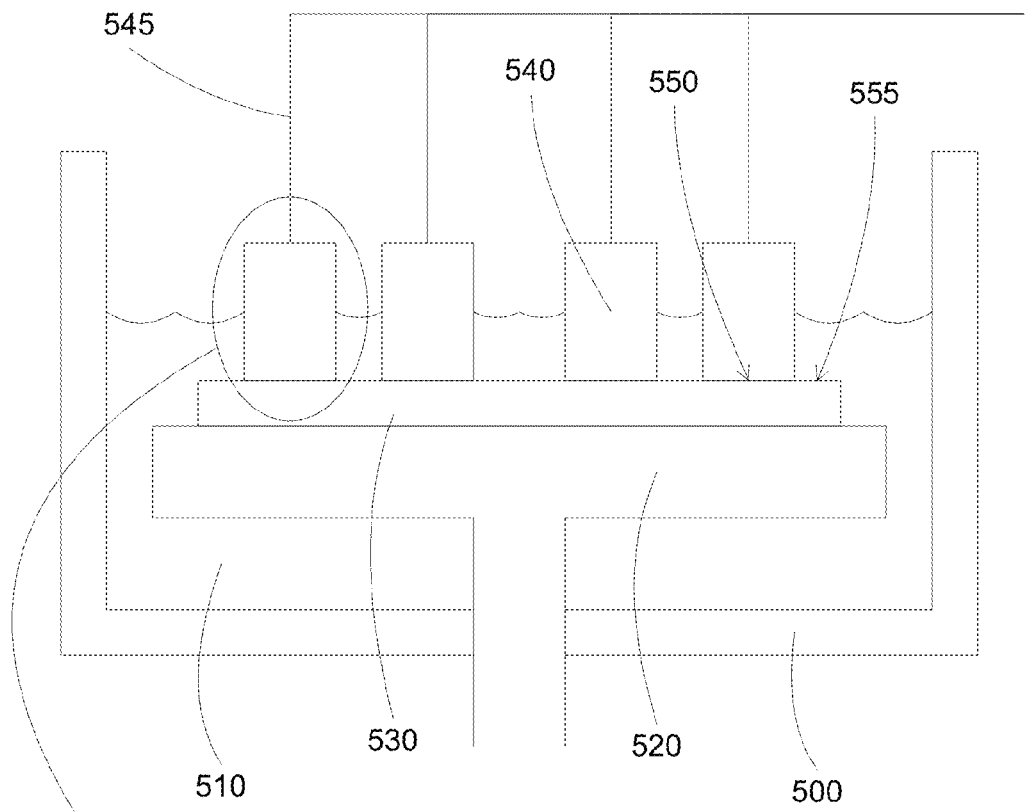
FIGS. 5A-5B illustrate an exemplary outside surface processing according to some embodiments of the present invention.
Figure 5B:
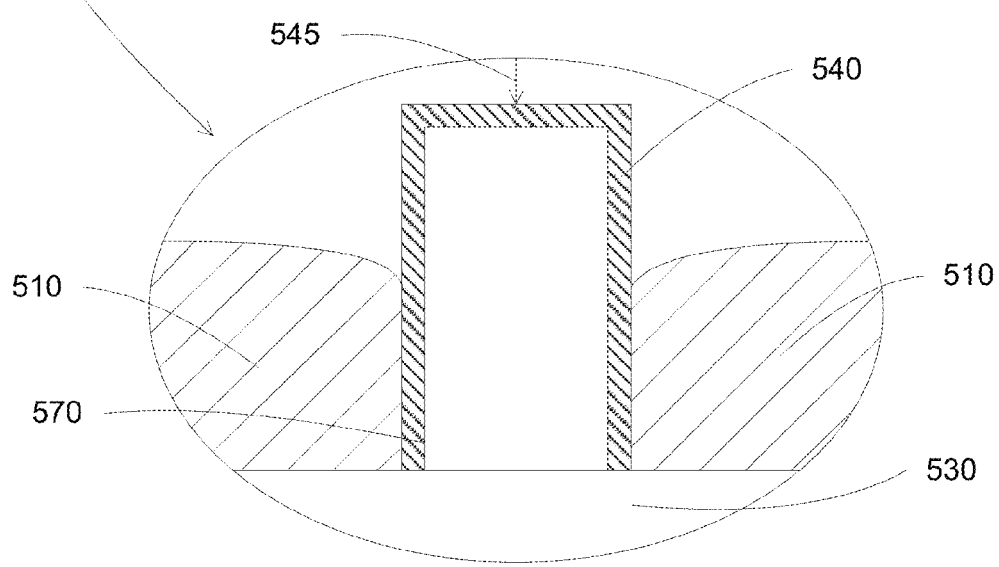

FIGS. 5A-5B illustrate an exemplary outside surface processing according to some embodiments of the present invention. In FIG. 5A, a process chamber 500 supports a chuck 520 having a substrate 530 disposed thereon. The substrate 530 is submerged in a processing fluid 510, for example, a cleaning fluid, a rinsing fluid, or an etching fluid. The process chamber 500 can be a part of a HPC system, which comprises a plurality of protective chucks 540 protecting isolated regions 550 of the substrate. Gas lines 545 can be supplied to the protective chucks 540, for example, to pressurize the inside of the protective chucks 540 against the surrounding fluid 510. The surface area 555 of the substrate, outside the protected isolated regions 550, is processed by the processing fluid 510.

FIG. 5B shows an exemplary configuration of a protective chuck 540 protecting surface 550 regions of the substrate 530 against the fluid processing 510. The protective chuck 540 is pressed against the substrate 530, preventing the fluid 510 from entering the surface region 550. The fluid 510 thus stays within the surface region 555, outside the region 550. The protective chucks 540 can be the same or different from the processing reactors 402a-402c.

In some embodiments, the present invention discloses methods for cleaning an object using gas pressure, which can be applied toward cleaning processing reactors, e.g., 402a-402c. The object to be cleaned can be disposed in a fluid medium, and a gas flow can be used to pressurize the interior of a processing reactor, vibrating it against the substrate surface. The vibration energy can be transferred to the adhering particles, dislodging the particles from the reactor surface to be released to the fluid medium. The object preferably comprises a hollow interior which is communicated with a surface opening, such as a processing reactor similar to processing reactors 402a-402c.

In some embodiments, the cleaning process comprises applying a force to the object to press the object against a substrate surface to form a seal, sealing the opening of the object by the substrate surface. The object and the substrate are partially submerged in a fluid, wherein the fluid covers at least the seal area between the object opening and the substrate surface. A gas is flowed to the interior of the object to build up a gas pressure within the object interior. When the force on the object interior caused by the gas pressure is higher than the externally applied force, the object is lifted from the substrate surface, and the gas is released through the opening. The gas pressure is reduced, and the object falls back to the substrate. The cycle continues with the object vibrates against the substrate surface. The vibration can clean the object from any adhering particles, for example, particles at the seal area between the object and the substrate.

Figure 6A:
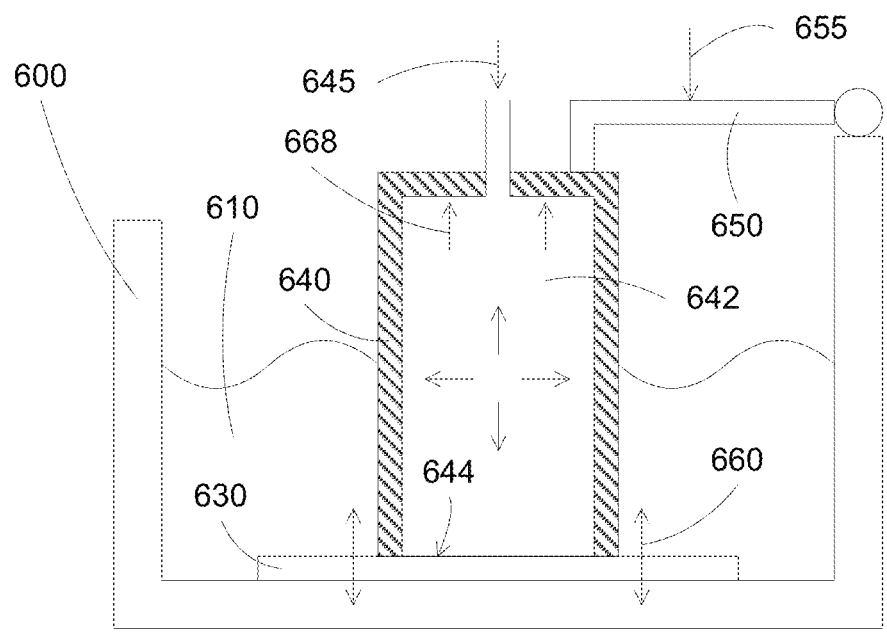
FIGS. 6A-6B illustrate an exemplary configuration using gas pressure to vibrate an object according to some embodiments of the present invention.
Figure 6B:
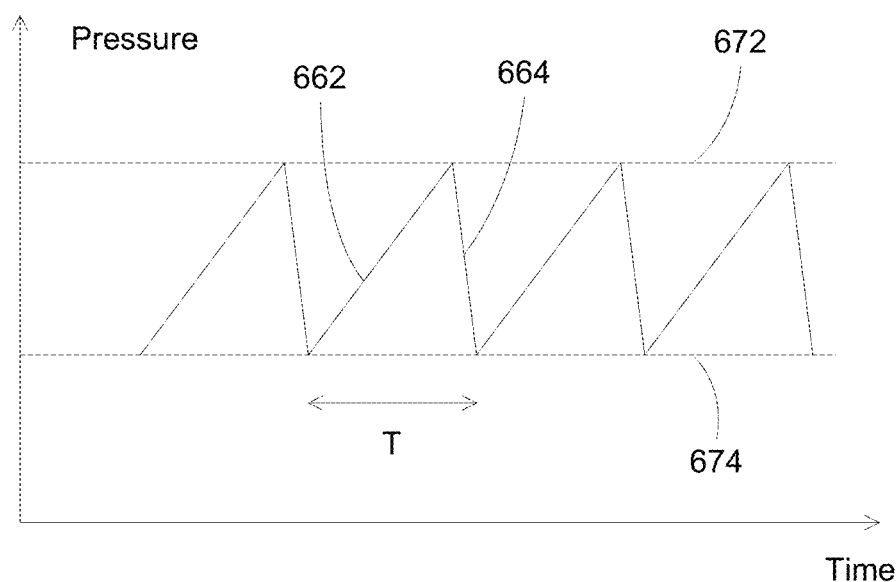

FIGS. 6A-6B illustrate an exemplary configuration using gas pressure to vibrate an object according to some embodiments of the present invention. An object 640 comprises a hollow interior 642, which communicates with an external opening 644, and accepts a gas flow 645 to the hollow interior 642. The object 640 is pressed against a substrate 630, for example, by a cantilever 650 having an applied force 655. The substrate 630 forms a seal, sealing the opening 644 of the object 640, with the strength of the seal proportional to the applied force 655.

Alternatively, the object 640 can be pressed against the substrate 630 by its own weight, or by other pressing mechanisms. Also, the object 640 can be pressed against any surface, such as the chamber wall surface of container 600. The substrate 630 can be attached to the container wall, for example, through a clamping mechanism.

The area of the seal between the object opening 644 and the substrate 630 is submerged in a fluid 610. In some embodiments, the substrate and the object are disposed in a tank of fluid, with substrate submerged in the fluid, and the object partially or fully submerged.

FIG. 6B illustrates the change in pressure inside the object over time. Gas flow 645 generates a gas pressure in the hollow interior 642 of the object 640. With the opening 644 sealed off, the pressure is gradually increasing 662 with time. When the gas pressure reaches a first critical pressure 672, some of the gas can escape through the interface, e.g., the seal area between the object opening and the substrate. For example, the gas pressure can exert a force 668 against the top of the object, counteracting the applied force 655 pressing the object against the substrate surface. When the pressure force 668 exceeds the applied force 655, the object 640 is lifted from the substrate, loosening the seal between the object and the substrate. Gas is released to the fluid medium 610, and the pressure in the hollow interior of the object quickly drops 664. When the gas pressure drops below a second critical pressure 674, the object falls back to the substrate, re-sealing the opening and stopping the gas release. For example, the pressure released causes the force 668 to be reduced. When the force 668 is less than the applied force 655, the object 640 is again pressed against the substrate, re-establishing the seal between the object and the substrate. With the seal re-seals the hollow interior, the pressure now increases, and the cycle continues.

The object is observed to be vibrated during the increase 662 of the gas pressure, for example, when gas is flowed at a high rate or high pressure into the small volume inside the object. Potentially, the turbulence of the gas inside the small volume could be sufficient to generate this vibration. In some embodiments, the vibration does not occur when the gas escapes the small volume, for example, during the pressure drop 664. The vibration can dislodge any particles on the object surface, and in general, cleaning the object, especially the opening area 644 contacting the substrate.

Figure 7A:
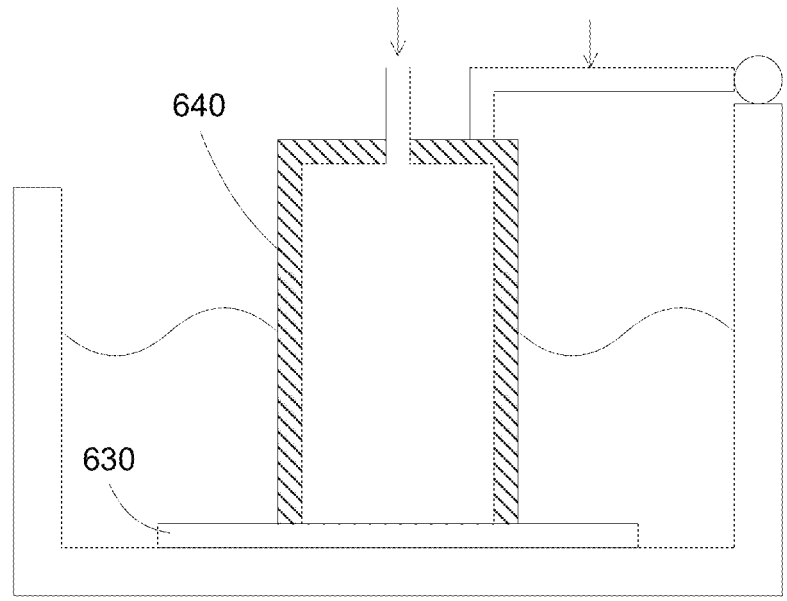
FIGS. 7A-7B illustrate an exemplary movement of the object due to the gas flow according to some embodiments of the present invention.
Figure 7B:
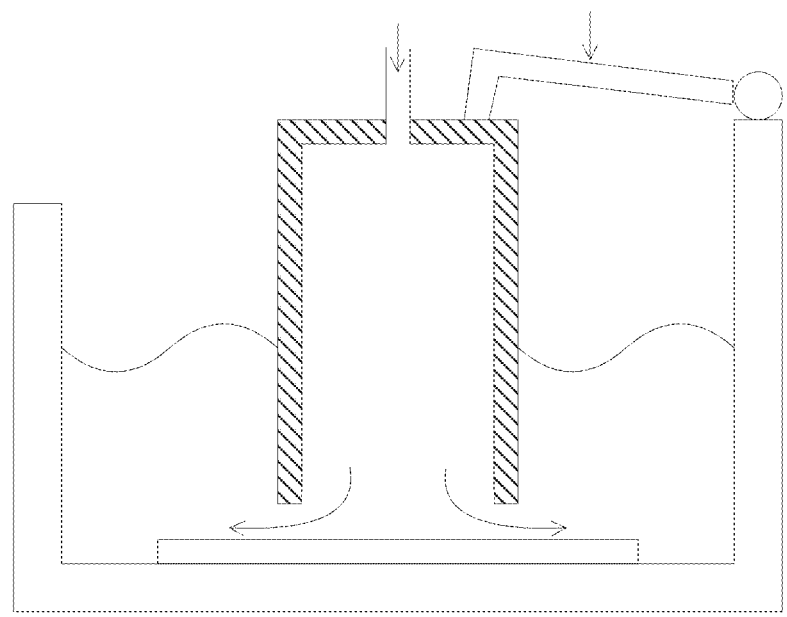

FIGS. 7A-7B illustrate an exemplary movement of the object due to the gas flow according to some embodiments of the present invention. In FIG. 7A, the object 640 is pressed against the substrate 630, sealing the interior volume of the object. The gas flow to the object interior increases the pressure. In FIG. 7B, the object is lifted from the substrate due to the increased pressure, loosening the seal with the substrate. The pressure is released, and the interior gas escapes through the object opening. The object then falls back to the substrate, and the movement continues to vibrate the object against the substrate.

In some embodiments, the vibration frequency can be controlled by the applied force and the gas flow rate. For example, a high gas flow rate can quickly build up the pressure within the object, which increases the frequency of vibration. Similarly, lower applied force can be quickly overcome by the built up pressure, which also increases the frequency of vibration.

In some embodiments, the applied force is less than 10 psi, and preferably less than 7 psi. The gas flow rate can be less than 20 l/min, and preferably less than 10 l/min. Under these conditions, a vibration frequency between 100 Hz and 10 kHz can be achieved, providing an effective cleaning of the object surface.

In some embodiments, the fluid comprises water, preferably deionized water, and the cleaning action comprises imparting vibration energy to the particles to remove them from the object surface. In some embodiments, the fluid comprises a cleaning solution, supplementing the vibrational cleaning with chemical action. After cleaning with the cleaning solution, the cleaning fluid can be replaced with water to rinse, or to clean again with water.

In some embodiments, the substrate can be replaced or the object can be moved to a new location on the substrate surface. During the cleaning process, particles might be transferred from the object to the substrate, especially at the contact area. Replacing the substrate or moving the object to a new location can prevent re-contaminating the object.

In some embodiments, the cleaning time is less than 20 minutes, and preferably less than 15 minutes. In some embodiments, the gas comprises air, inert gas such as argon, or inactive gas such as nitrogen. The gas flow can also be constant, or pulsed.

In some embodiments, the present vibrational cleaning process can be used in a high productivity combinatorial (HPC) system. During normal operation of an HPC system, a reactor module comprising a plurality of reactors can create a plurality of isolated regions on a substrate surface. The isolated regions are processed with process conditions, device structure or materials varying in a combinatorial manner. In an exemplary configuration, a reactor comprises a sleeve shape, pressing on a region of the substrate surface to create an isolated processing region. The pressing contact can generate particles accumulated on the reactor, which will need to be periodically cleaned.

In some embodiments, the present invention discloses systems and methods for in-situ cleaning a reactor module of a HPC system, comprising vibrating the reactor module using compressed gas. The in-situ cleaning process comprises introducing a substrate to a processing chamber of the HPC system, preferably a dummy substrate, and pressing the reactor module against the substrate. A fluid is introduced to the processing chamber, similar to a substrate surface cleaning process of the regions outside the isolated reactor regions. A gas flow is introduced to the interior of the reactors of the reactor module to vibrate the reactor against the substrate surface. The vibration energy can be imparted to the reactors to clean the reactors. Additionally, cleaning solution can be used.

Figure 8:
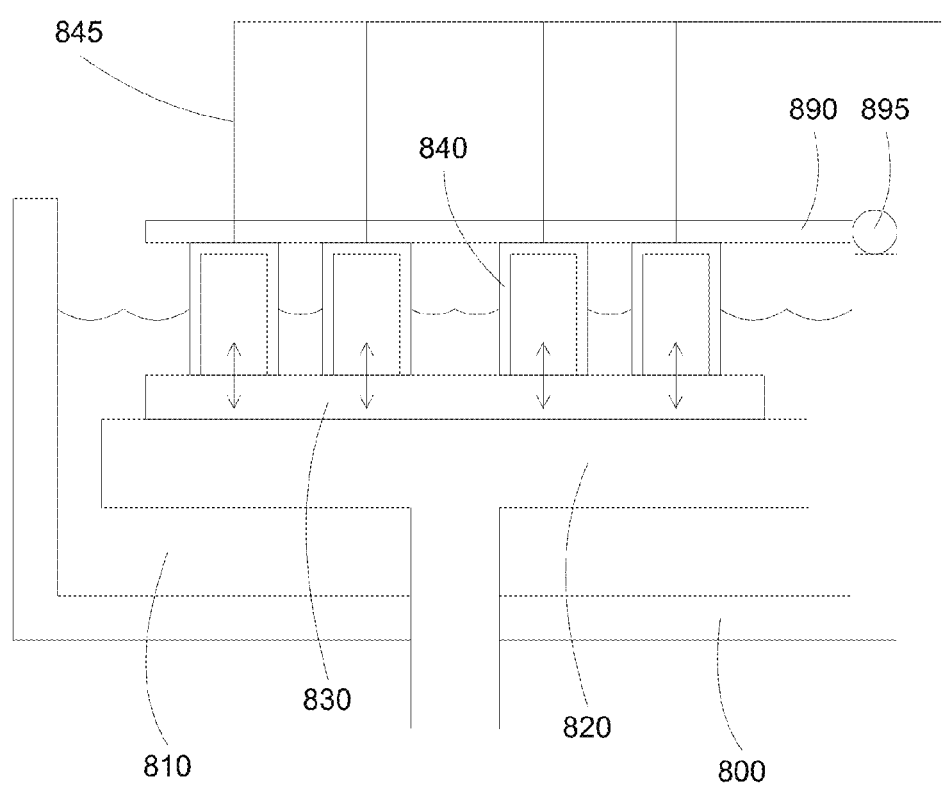
FIG. 8 illustrates an exemplary cleaning configuration in an HPC process chamber according to some embodiments of the present invention.

FIG. 8 illustrates an exemplary cleaning configuration in an HPC process chamber according to some embodiments of the present invention. The cleaning process can clean the reactor assembly 890, using configurations of an outside surface cleaning process. A reactor assembly 890 comprising a plurality of reactors 840 is pressed against a substrate 830, which is disposed on a substrate support 820. The reactor assembly is coupled to the HPC chamber 800, for example, through a pressing mechanism 895. The chamber 800 is then filled with fluid 810, for example, water or cleaning solution, at least to cover the sealing areas between the reactors 840 and the substrate 830. Gas flow 845 is then introduced to the interior of the reactors 840, vibrating the reactors against the substrate surface. The vibrational energy can be transferred to the reactor surfaces, in-situ cleaning the reactor assembly without the need to remove the reactor assembly 890 from the HPC system.

In some embodiments, the present invention discloses methods to operate an HPC system, comprising periodically cleaning the reactor module in-situ after a number of processed substrates. After processing a number of substrates, the reactor surfaces, especially the surface in contact with the substrate, can be contaminated with particles, for example, due to contact friction. In some embodiments, the present invention discloses cleaning the reactors, preferably in-situ cleaning, after processing a number of substrates to reduce or eliminate the particles adhering to the reactor surfaces.

Figure 9A:
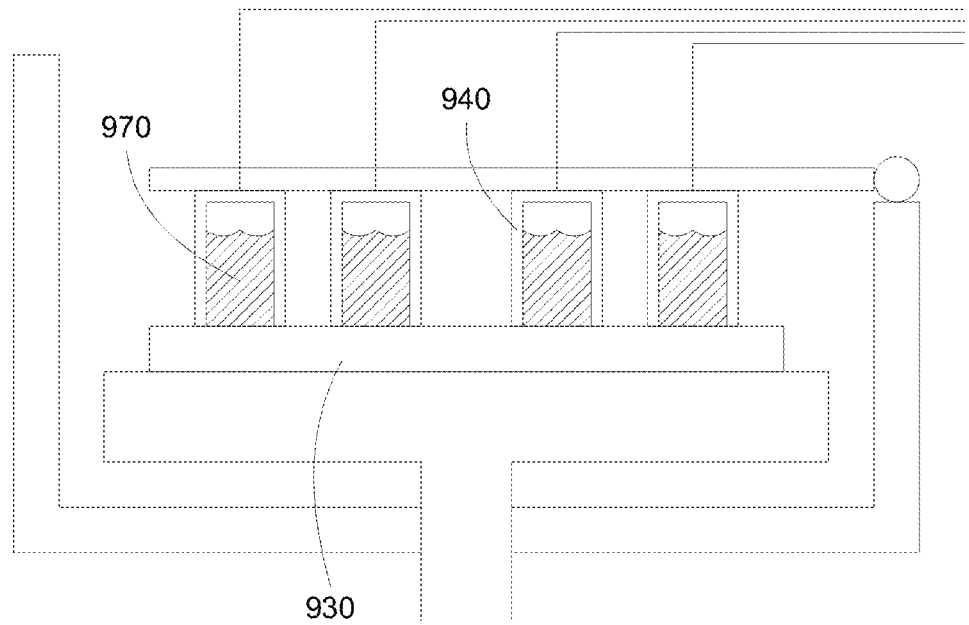
FIGS. 9A-9B illustrate an exemplary in-situ cleaning process according to some embodiments of the present invention.
Figure 9B:
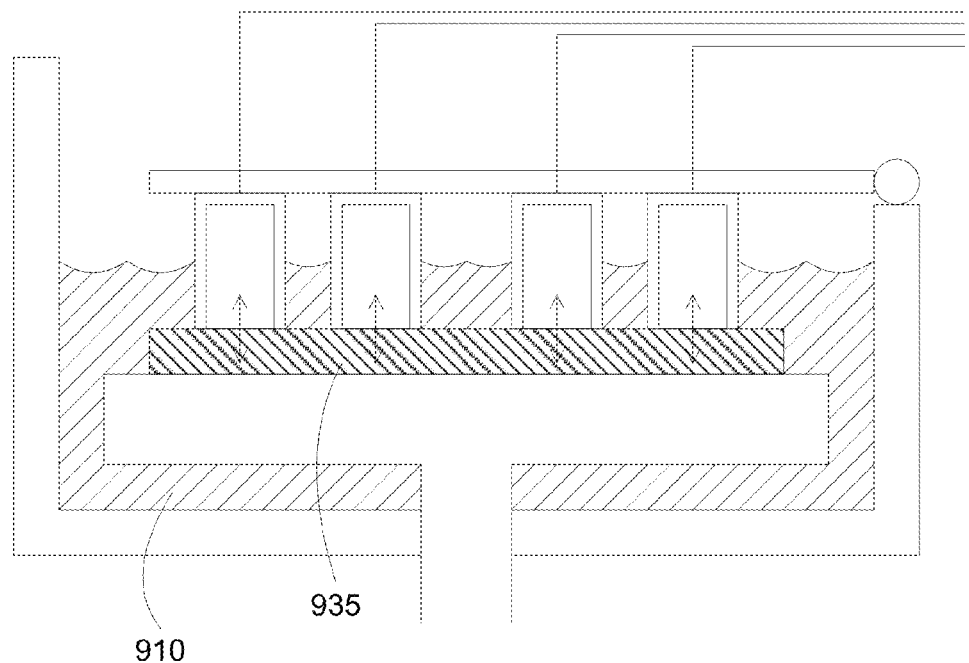

FIGS. 9A-9B illustrate an exemplary in-situ cleaning process according to some embodiments of the present invention. In FIG. 9A, combinatorial process is performed on substrate 930, using reactors 940 with different chemicals 970 on isolated regions of the substrate. After processing a number of substrates, the reactors 940 can be cleaned, for example, to remove any particles generated during the processing, particularly due to the frictional contact between the reactors with the substrate surface.

In FIG. 9B, a dummy substrate 935 is introduced to the process chamber. The reactors are pressed against the dummy substrate, and the chamber is filled with cleaning fluid 910, such as water or cleaning solvent. Gas flow is introduced to the reactors, vibrating the reactors to dislodge any particles on the reactors. After about 10-20 minutes cleaning, the fluid 910 is drained. Multiple cleaning processes can be performed, for example, with different dummy substrates, or with different locations on the same dummy substrate. New fluid can be used, such as a rinsing fluid for rinsing the reactors after solvent cleaning.

In some embodiments, the reactor module is in-situ cleaned after being used for processing less than 20 substrates, and preferably less than 10 substrates.

Figure 10:
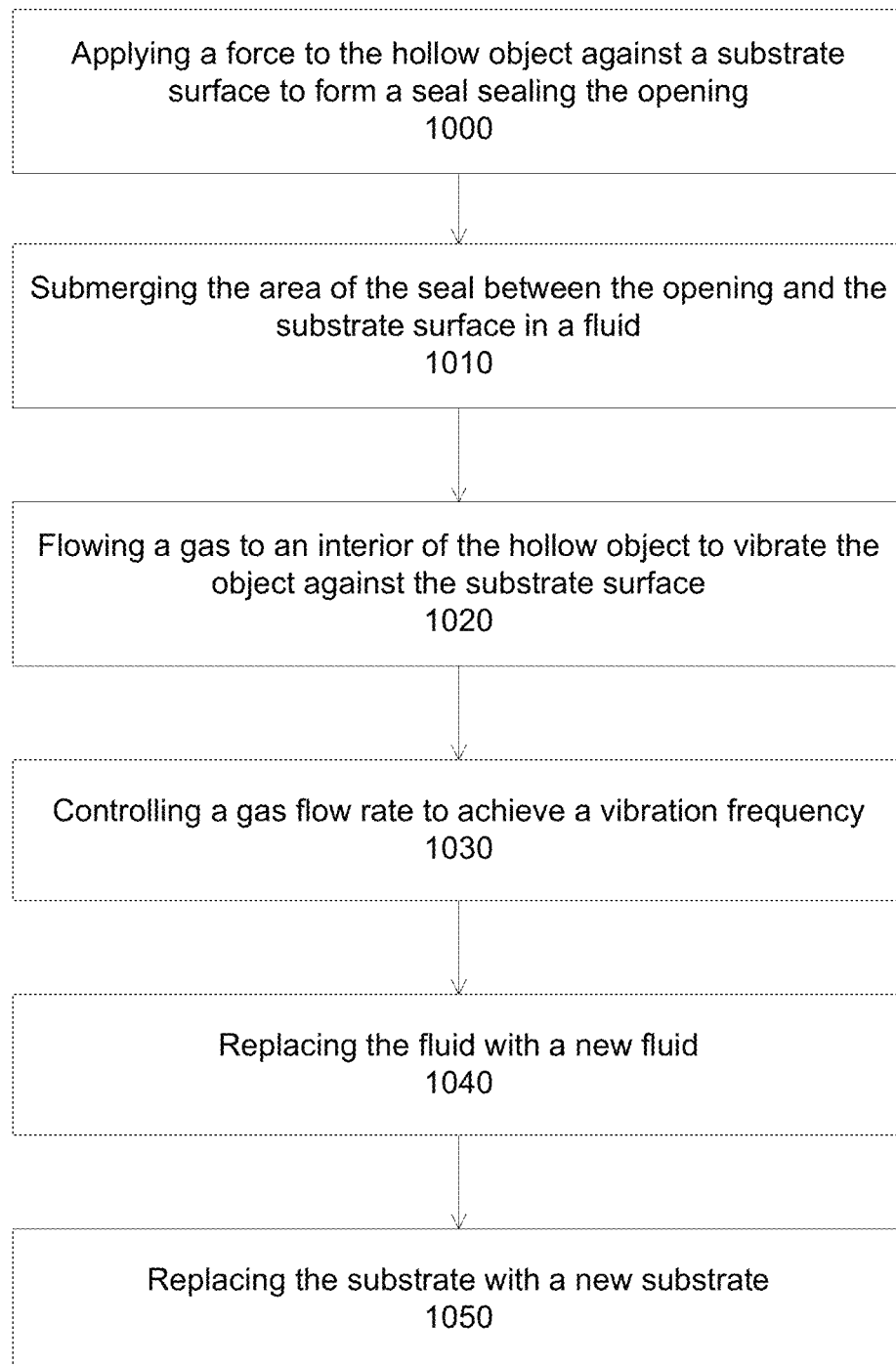
FIG. 10 illustrates an exemplary flowchart for cleaning a hollow object according to some embodiments of the present invention.

FIG. 10 illustrates an exemplary flowchart for cleaning a hollow object according to some embodiments of the present invention. In operation 1000, a force is applied to the hollow object against a substrate surface to form a seal, sealing the opening. In operation 1010, the area of the seal between the opening and the substrate surface is submerged in a fluid. In operation 1020, a gas is flowed to an interior of the hollow object to vibrate the object against the substrate surface. In operation 1030, a gas flow rate is controlled to achieve a vibration frequency. In operation 1040, the fluid is replaced with a new fluid. In operation 1050, the substrate is replaced with a new substrate.

FIG. 11 illustrates an exemplary flowchart for cleaning the reactors in an HPC system according to some embodiments of the present invention. In operation 1100, a force is applied to the reactor module to seal each reactor of the reactor module against a substrate surface. In operation 1110, a fluid is introduced to immerse the substrate and a portion of the reactor module. In operation 1120, a gas is flowed to an interior of at least a reactor of the reactor module to vibrate the reactor against the substrate surface. In operation 1130, a gas flow rate is controlled to achieve a vibration frequency of the reactor. In operation 1140, the fluid is replaced with a new fluid. In operation 1150, the substrate is replaced with a new substrate.

FIG. 12 illustrates an exemplary flowchart for in-situ cleaning the reactors in an HPC system according to some embodiments of the present invention. In operation 1200, combinatorial processing is performed on multiple regions of a first substrate in the HPC equipment using the reactor module. In operation 1210, the reactor module is cleaned in-situ, comprising introducing a second substrate, applying a force to the reactor module to seal each reactor of the reactor module against the second substrate surface, introducing a fluid to immerse the second substrate and a portion of the reactor module, and flowing a gas to an interior of at least one reactor of the reactor module to vibrate the reactor against the second substrate surface. In operation 1230, the process continues, performing combinatorial processes on a new substrate using the cleaned reactor module.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A method for cleaning an object having a hollow interior and an opening, the method comprising:
    applying a force to the object against a substrate surface;
    forming a contact between the opening and the substrate surface;
    submerging the contact in a fluid;
    flowing a gas to the interior of the object to vibrate the object; and
    controlling a gas flow rate to achieve a vibration frequency.

2. A method as in claim 1 wherein the fluid comprises water or a cleaning fluid.

3. A method as in claim 1 wherein the gas comprises air or nitrogen.

4. A method as in claim 1 wherein the gas flow is constant or pulsed.

5. A method as in claim 1 wherein the applied force is less than 7 psi.

6. A method as in claim 1 further comprising
    replacing the fluid with a new fluid.

7. A method as in claim 1 further comprising
    replacing the substrate with a new substrate.

* * * * *